(12) United States Patent
Shimizu et al.

(10) Patent No.: US 8,742,430 B2
(45) Date of Patent: Jun. 3, 2014

(54) ORGANIC LIGHT EMITTING ELEMENT

(75) Inventors: Masao Shimizu, Hitachi (JP); Shingo Ishihara, Mito (JP); Hiroshi Sasaki, Mito (JP); Tatsuya Sugita, Takahagi (JP)

(73) Assignees: Japan Display Inc., Tokyo (JP); Panasonic Liquid Crystal Display Co., Ltd., Hyogo-ken (JP)

( * ) Notice: Subject to any disclaimer, the term of this patent is extended or adjusted under 35 U.S.C. 154(b) by 551 days.

(21) Appl. No.: 12/542,085

(22) Filed: Aug. 17, 2009

(65) Prior Publication Data
US 2010/0059778 A1 Mar. 11, 2010

(30) Foreign Application Priority Data
Sep. 11, 2008 (JP) ................................ 2008-232896

(51) Int. Cl.
*H01L 27/15* (2006.01)

(52) U.S. Cl.
USPC .............. 257/79; 257/E51.021; 257/E33.067; 313/506

(58) Field of Classification Search
None
See application file for complete search history.

(56) References Cited

U.S. PATENT DOCUMENTS

| | | | | |
|---|---|---|---|---|
| 6,280,838 | B1 * | 8/2001 | Bernards et al. | 428/325 |
| 2003/0127973 | A1 * | 7/2003 | Weaver et al. | 313/504 |
| 2005/0194896 | A1 * | 9/2005 | Sugita et al. | 313/506 |
| 2007/0063628 | A1 * | 3/2007 | Cok et al. | 313/110 |
| 2008/0246393 | A1 * | 10/2008 | Qiu et al. | 313/504 |
| 2009/0072733 | A1 | 3/2009 | Funayama et al. | |

FOREIGN PATENT DOCUMENTS

| | | |
|---|---|---|
| JP | 2004-296437 | 10/2004 |
| JP | 2005-251488 | 9/2005 |
| JP | 2005-353367 | 12/2005 |
| JP | 2006-100137 | 4/2006 |
| JP | 2007-242286 | 9/2007 |
| WO | WO 2006/095632 | 9/2006 |

\* cited by examiner

*Primary Examiner* — Fei Fei Yeung Lopez
(74) *Attorney, Agent, or Firm* — Antonelli, Terry, Stout & Kraus, LLP.

(57) ABSTRACT

An object of the present invention is to provide an organic light emitting element where light emitted from the light emitting layer is efficiently emitted to the outside, and thus, the efficiency of light emission is higher. The present invention provides an organic light emitting element where a first reflective electrode 22, an electron transport layer 23, a light emitting layer 24, a hole transport layer 25, a hole injection layer 26 and a second transparent electrode 27 are formed on a glass substrate 21, and a light extraction layer 28 having an average index of refraction of 1.4 made of titanium particles having an index of refraction of 2.6 and an average particle diameter of 150 nm and silica sol.

12 Claims, 11 Drawing Sheets

FIG. 2
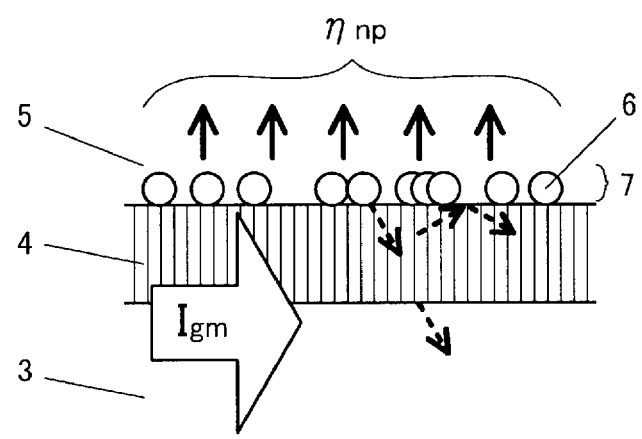
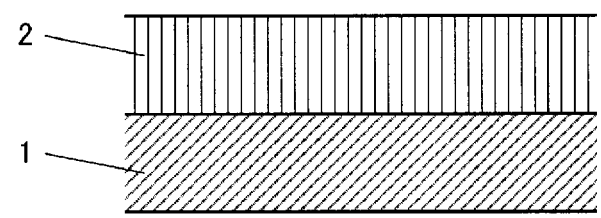

|  | | Filling factor | | | |
|---|---|---|---|---|---|
|  | | 39% | 47% | 55% | 63% |
| Index of refraction of particles | 1.5 | 1.20 | 1.24 | 1.27 | 1.31 |
| | 1.6 | 1.24 | 1.28 | 1.33 | 1.38 |
| | 1.7 | 1.27 | 1.33 | 1.38 | 1.44 |
| | 1.8 | 1.31 | 1.38 | 1.44 | 1.50 |
| | 1.9 | 1.35 | 1.42 | 1.49 | 1.57 |
| | 2 | 1.39 | 1.47 | 1.55 | 1.63 |
| | 2.1 | 1.43 | 1.52 | 1.60 | 1.69 |
| | 2.2 | 1.47 | 1.57 | 1.66 | 1.75 |
| | 2.3 | 1.51 | 1.61 | 1.71 | 1.82 |
| | 2.4 | 1.55 | 1.66 | 1.77 | 1.88 |
| | 2.5 | 1.59 | 1.71 | 1.82 | 1.94 |
| | 2.6 | 1.63 | 1.75 | 1.88 | 2.01 |

ORGANIC LIGHT EMITTING ELEMENT

The present application claims priority over Japanese Application JP 2008-232896 filed on Sep. 11, 2008, the contents of which are hereby incorporated into this application by reference.

BACKGROUND OF THE INVENTION (1) Field of the Invention

The present invention relates to an organic light emitting element which consumes little power and has a long life.

(2) Related Art Statement

Organic light emitting elements are self-luminous, and therefore, make a backlight unnecessary when used in a display device, which is thus characterized by being thin and lightweight. Furthermore, organic light emitting elements have a wide view angle, and are characterized by their high response speed, and thus, are appropriate for moving image displaying devices. In addition, organic light emitting elements have a wide view angle and emit light through a surface, and thus, are appropriate for light emitting devices, such as for illumination.

In addition, organic light emitting elements have a structure where a lower electrode, a carrier transport layer, a light emitting layer and an upper electrode are layered on top of each other, and emit light as a result of recombination of electrons injected into the light emitting layer through an electron transport layer from the lower electrode, and holes injected into the light emitting layer through a hole transport layer from the upper electrode, for example.

Organic layers for organic light emitting elements and transparent electrodes for use as a contact electrode have a higher index of refraction than the air, which is a light extraction layer.

Therefore, it can be said that the intensity of light emitted into the air layer from the light emitting layer is approximately 20%, and most of the emitted light is totally reflected in the interface between the transparent electrode and the air layer and guided through the organic layer or transparent electrode layer.

Therefore, it is important to increase the efficiency of light emission, by reducing the loss when light is guided through the organic light emitting element, in order to implement an organic light emitting element which consumes little power.

In addition, it becomes possible to lower the current value required to gain a certain brightness by making the efficiency high in the organic light emitting element. It is known that the life of organic light emitting elements is proportional to the power of the inverse of the drive current, and thus, drive with a low current, as a result of the high efficiency, leads to a long life for the organic light emitting element.

Patent Document 1 discloses a structure provided with a light exuding diffusion layer in order to achieve an object of increasing the efficiency of light emission. A light exuding diffusion layer where a matrix having a low index of refraction contains transparent, microscopic particles for scattering light is provided on top of the second electrode, which is used as an electrode for emitting light.

Light which enters at an angle greater than the critical angle is totally reflected in the interface between the second electrode and the light exuding diffusion layer, and there is exuded light which propagates along the interface. Therefore, exuded light in the light exuding diffusion layer is scattered by the diffusing microscopic particles and propagates through the light exuding diffusion layer.

The results of our examination suggest that the structure disclosed in Patent Document 1 does not meet the conditions for increasing the efficiency of light emission. The details are given below.

In addition, Patent Document 2 describes a technology for increasing light emission by providing a light scattering layer where a first particle matrix and a second particle matrix contain transparent, microscopic particles.

In Patent Document 2, two types of matrixes with a different index of refraction contain transparent, microscopic particles, and the manufacturing method is advanced, making the cost high.

[Patent Document 1] Japanese Unexamined Patent Publication
[Patent Document 2] Japanese Unexamined Patent Publication 2005-353367

SUMMARY OF THE INVENTION

Problem to be Solved by the Invention

An object of the present invention is to provide an organic light emitting element having a highly efficient light extraction layer from which light is emitted directly into an air layer.

Another object of the present invention is to provide an organic light emitting element covered with a facing substrate or a resin layer with a structure having high efficiency for light emission.

Still another object of the present invention is to provide an organic light emitting display device or organic light emitting device using the above described organic light emitting element.

Means for Solving Problem

In order to achieve the above describe object, the organic light emitting element according to the present invention has a structure with at least a light emitting layer on a substrate and a pair of electrodes provided so as to sandwich the above described light emitting layer, where one of the above described pair of electrodes is a transparent electrode, and is characterized in that the average index of refraction of a light extraction layer formed on the above described transparent electrode is 1.4 or higher in a region between the interface between the above described transparent electrode and the above described light extraction layer, and the point to which light exudes from the above described transparent electrode to the above described light extraction layer, and microscopic particles forming the above described light extraction layer have an index of refraction of 2 or higher.

In addition, it is desirable for the above described microscopic particles to be connected by means of a support body in the above described light extraction layer.

Furthermore, it is desirable for the film thickness of the above described support body to be in a range from 0.1 nm to 10 nm.

Moreover, it is desirable for the above described light extraction layer to be formed of two or more types of microscopic particles with a different average particle diameter.

In addition, it is desirable for the above described microscopic particles to have a cluster structure where the average diameter of the microscopic particles is 80 nm or less.

Furthermore, it is desirable for the above described light extraction layer to have such a structure as to make contact with the facing substrate, for a second light extraction layer having an average index of refraction of 1.5 or higher to be formed in the interface between a resin layer through which the above described light extraction layer makes contact with the above described facing substrate and the above described facing substrate, and for microscopic particles forming the above described light extraction layer to have an index of refraction of 1.8 or higher.

Moreover, it is desirable for the above described light extraction layer to have such a structure as to make contact with the facing substrate, for a second light extraction layer having an average index of refraction of 1.5 or higher to be formed in the interface between the above described facing substrate and the above described light extraction layer, which is an air layer, and for microscopic particles forming the above described light extraction layer to have an index of refraction of 1.8 or higher.

In addition, in order to achieve the above described object, the organic light emitting element according to the present invention has a structure with at least a light emitting layer on a substrate and a pair of electrodes provided so as to sandwich the above described light emitting layer, where one of the above described pair of electrodes is a transparent electrode, and is characterized in that the average index of refraction of a light extraction layer formed on the above described transparent electrode is 1.4 or higher in a region between the interface between the above described transparent electrode and the above described light extraction layer, and the point to which light exudes from the above described transparent electrode to the above described light extraction layer, the above described light extraction layer has such a structure as to make contact with a facing substrate, a second light extraction layer having an average index of refraction of 1.5 or higher is formed in the interface between a resin layer through which the above described light extraction layer makes contact with the above described facing substrate and the above described facing substrate, and microscopic particles forming the above described light extraction layer have an index of refraction of 1.8 or higher.

Furthermore, in order to achieve the above described object, the organic light emitting element according to the present invention has a structure with at least a light emitting layer on a substrate and a pair of electrodes provided so as to sandwich the above described light emitting layer, where one of the above described pair of electrodes is a transparent electrode, and is characterized in that the average index of refraction of a light extraction layer formed on the above described transparent electrode is 1.4 or higher in a region between the interface between the above described transparent electrode and the above described light extraction layer, and the point to which light exudes from the above described transparent electrode to the above described light extraction layer, the above described light extraction layer has such a structure as to make contact with a facing substrate, a second light extraction layer having an average index of refraction of 1.5 or higher is formed in the interface between the above described facing substrate and the above described light extraction layer, which is an air layer, and microscopic particles forming the above described light extraction layer have an index of refraction of 1.8 or higher.

Effects of the Invention

The present invention makes it possible to increase the efficiency of light emission in organic light emitting elements, and thus, lower power consumption can be achieved for organic light emitting display devices and organic display devices using an organic light emitting element.

In addition, the present invention makes it possible to lower the drive current by increasing the efficiency of light emission, and thus, the life of organic light emitting elements, organic light emitting display devices, and organic light emitting devices using an organic light emitting element can be prolonged.

Furthermore, the present invention can increase the efficiency of light emission also in practical organic light emitting elements covered with a facing substrate or the like.

BRIEF DESCRIPTION OF THE DRAWINGS

FIG. 2 is a cross sectional diagram showing an organic light emitting element used for a simulation for light emission;

Figure 1:
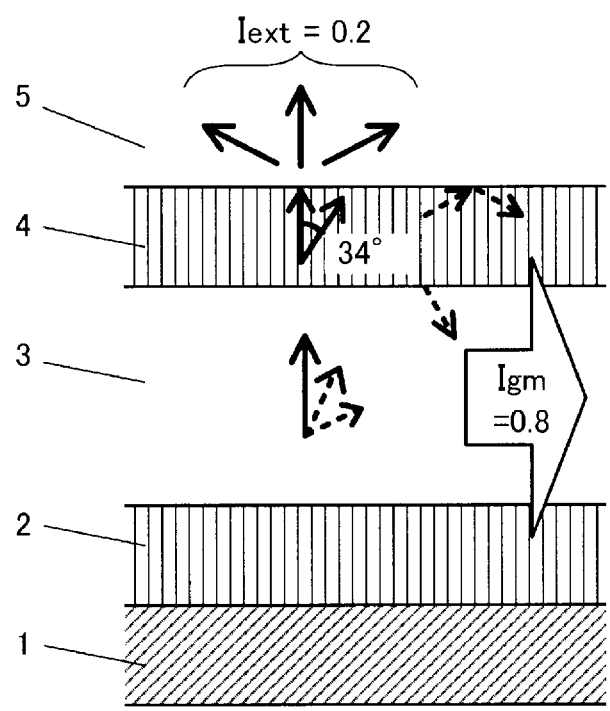
FIG. 1 is a cross sectional diagram showing an organic light emitting element used for a simulation for light emission.

EXPLANATION OF SYMBOLS 1, 103, 104, 105, 203, 204, 205, 303, 304, 305 . . . lower reflective electrodes
2 . . . transparent electrode
3 . . . organic layer
4 . . . upper transparent electrode
5 . . . air layer
6, 38, 39, 48 . . . microscopic particles
7, 28, 40, 50 . . . light extraction layer
21, 31, 41, 101, 201, 301 . . . substrate
22, 32, 42 . . . first electrode
23, 33, 43, 101, 113, 115, 210, 213, 215, 310, 313, 315 . . . electron transport layers
24, 34, 44 . . . light emitting layer
25, 35, 45, 107, 108, 111, 207, 208, 211, 307, 308, 311 . . . hole transport layers
26, 36, 46 . . . hole injection layer
27, 37, 47 . . . second electrode
29, 400, 500, 119, 219, 319 . . . OLED substrate
102, 202, 302 . . . drive layer
106, 206, 306 . . . insulating film
109, 209, 309 . . . R light emitting layer
110, 210, 310 . . . G light emitting layer
111, 211, 311 . . . B light emitting layer
116, 216, 316 . . . upper transparent electrode
117, 217, 317 . . . protective film
118, 218, 318 . . . light extraction layer
120, 220, 319 . . . facing substrate
222, 321 . . . second light extraction layer 223, 320 ... thermosetting resin layer
418, 518 ... third light extraction layer

DETAILED DESCRIPTION OF THE INVENTION

The organic light emitting element according to the present invention has the following structure. That is to say, the organic light emitting element is formed of a substrate, a lower electrode, a first injection layer, a first transport layer, a light emitting layer, a second transport layer, a second injection layer, an upper electrode, and a protective layer or sealing substrate (facing substrate) in this order.

There are two combinations for the lower electrode and the upper electrode.

In the first structure, the lower electrode is an anode and the upper electrode is a cathode.

In this case, the first injection layer and the first transport layer are a hole injection layer and a hole transport layer, respectively. In addition, the second transport layer and the second injection layer are an electron transport layer and an electron injection layer, respectively.

In the second structure, the lower electrode is a cathode and the upper electrode is an anode.

In this case, the first injection layer and the first transport layer are an electron injection layer and an electron transport layer, respectively. In addition, the second transport layer and the second injection layer are a hole transport layer and a hole injection layer, respectively.

In the above, a structure where there is no first injection layer or second injection layer is also possible. In addition, a structure where the light emitting layer works as the first transport layer or second transport layer is also possible.

It is desirable in the combination of the upper electrode and the lower electrode for one electrode to allow emitted light to transmit and the other electrode to reflect emitted light. In this case, light is emitted from the transmissive electrode, and therefore, the electrode is referred to as light emitting electrode. Meanwhile, the electrode having reflective properties is referred to as reflective electrode.

The present invention can be applied only to top emission structures in the case where the upper electrode is a light emitting electrode.

Here, it is possible to select any of a wide range of substrates, as long as they are made of an insulating material.

Concretely, inorganic materials, such as glass and sintered alumina bodies, and various types of insulating plastics, such as polyimide films, polyester films, polyethylene films, polyphenylene sulfide films and polyparaxylene films, can be used.

In addition, metal materials can also be used when an insulating material as that described above is pasted on the surface. Concretely, stainless steel, aluminum, copper and alloys containing these metals can be cited, but the substrate is not limited to these materials.

It is desirable for the above described anode to be a conductive film having a large work function, so that the efficiency of hole injection is high. Concretely, gold and platinum can be cited, but the anode is not limited to these materials.

In addition, the anode may be made of a two element based compound, such as indium tin oxide (ITO), indium zinc oxide (IZO) or indium germanium oxide, or a three element based compound, such as indium tin zinc oxide.

In addition, the anode may have a composition with tin oxide or zinc oxide as a main component, in addition to indium oxide. As concerns ITO, a composition having indium oxide including 5 wt % to 10 wt % of tin oxide is often used.

As concerns the manufacturing method for the oxide semiconductor, a sputtering method, an EB vapor deposition method and an ion plating method can be cited.

The work function of ITO films and IZO films is 4.6 eV and 4.6 eV, respectively, and it is possible to increase this to approximately 5.2 eV by irradiating them with UV rays in ozone, or through an oxygen plasma process.

ITO films become of a polycrystal state when fabricated in accordance with a sputtering method under such conditions that the substrate is heated to a temperature of approximately 200° C. In a polycrystal state, the flatness on the surface is poor, due to crystal particles, and therefore, it is desirable to polish the surface. In addition, it is desirable to heat an amorphous film formed in accordance with another method so that the film becomes of a polycrystal state.

In addition, it becomes unnecessary for the anode to be made of a material having a large work function when the below described hole injection layer is provided, and thus, the anode may be made of a conventional conductive film.

Concretely, a metal, such as aluminum, indium, molybdenum or nickel, an alloy using these metals, or an inorganic material, such as polysilicon, amorphous silicon, tin oxide, indium oxide or indium tin oxide (ITO) is desirable.

In the case where the anode is used as a reflective electrode, the anode may be a multilayer film where a transparent conductive film is formed on top of the reflective electrode made of a metal film. It is desirable for each layer to be made of one of the above described materials. The anode is, of course, not limited to these materials, and it is also possible to use two or more of these materials together.

In addition, it is desirable for the layers to be made from an organic material or a conductive ink, such as polyaniline or polythiophene, in accordance with an application method which makes the process simple. In addition, the material is, of course, not limited to these, and it is possible to use two or more of these materials together.

It is desirable for the above described hole injection layer to be made of a material having an appropriate ionization potential, so that the injection barrier between the anode and the hole transport layer is lower. In addition, it is desirable for the hole injection layer to work to level the uneven surface of the base layer.

Concretely, copper phthalocyanine, starburst amine compounds, polyaniline, polythiophene, vanadium oxide, molybdenum oxide, ruthenium oxide and aluminum oxide can be cited, but the material is not limited to these.

The above described hole transport layer works to transport holes that are then injected into the light emitting layer. Therefore, it is desirable for the hole transport layer to be made of a hole transport material having excellent hole mobility.

In addition, it is desirable for it to be chemically stable.

In addition, it is desirable for the ionization potential to be approximately the same as the work function of the anode.

In addition, it is desirable for the electron affinity to be small.

In addition, it is desirable for the glass transition temperature to be high.

Concretely, N,N'-bis(3-methylphenyl)-N,N'-diphenyl-[1,1'-biphenyl]-4,4' diamine (TPD), 4,4'-bis[N-(1-naphthyl)-N-phenyl amino]biphenyl (α-NPD), 4,4',4"-tri(N-carbazolyl) triphenyl amine (TCTA), 1,3,5-tris[N-(4-diphenylamino phenyl)phenyl amino]benzene (p-DPA-TDAB), 4,4',4"-tris (N-carbazole)triphenyl amine (TCTA), 1,3,5-tris[N,N-bis(2-methyl phenyl)-amino]-benzene (o-MTDAB), 1,3,5-tris[N,N-bis(3-methyl phenyl)-amino]-benzene (m-MTDAB), 1,3,5-tris[N,N-bis(4-methyl phenyl)-amino]-benzene (p-MTDAB), 4,4',4"-tris[1-naphthyl(phenyl)amino]triphenyl amine (1-TNATA), 4,4',4"-tris[2-naphthyl(phenyl) amino]triphenyl amine (2-TNATA), 4,4',4"-tris[biphenyl-4-yl-(3-methyl phenyl)amino]triphenyl amine (p-PMTDATA), 4,4',4"-tris[9,9-dimethyl fluorene-2-yl(phenyl)amino]triphenyl amine (TFATA), 4,4',4"-tris(N-carbazoyl)triphenyl amine (TCTA), 1,3,5-tris-[N-(4-diphenyl amino phenyl)phenyl amino]benzene (p-DPA-TDAB), 1,3,5-tris{4-[methyl phenyl(phenyl)amino]phenyl}benzene (MTDAPB), N,N'-di(biphenyl-4-yl)-N,N'-diphenyl [1,1'-biphenyl]-4,4'-diamine (p-BPD), N,N'-bis(9,9-dimethyl fluorene-2-yl)-N,N'-diphenyl fluorene-2,7-diamine (PFFA), N,N,N',N'-tetrakis(9,9-dimethyl fluorene-2-yl)-[1,1-biphenyl]-4,4'-diamine (FFD), (NDA) PP, and 4-4'-bis[N,N'-(3-tryl)amino]-3-3'-dimethyl biphenyl (HMTPD) are desirable. The material is, of course, not limited to these, and two or more of these materials may be used together.

In addition, it is desirable for the hole transport layer to include an oxidant in the above described hole transport material, so that the barrier against the anode is lower and the electric conductivity is higher. The hole transport layer may be provided in a layered structure having no hole injection layer. Concrete examples of oxidants are Lewis acid compounds, such as ferric chloride, ammonium chloride, gallium chloride, indium chloride and antimony pentachloride, which are electron acceptor compounds for trinitrofluorene. The material is, of course, not limited to these, and two or more of these materials may be used together.

The above described luminous layer is a layer for emitting light having a wavelength particular to the material, where injected holes and electrons recombine. There are cases where the host material that forms the light emitting layer emits light, and a minuscule amount of dopant that is added to the host material emits light.

Concretely, as the host material, di(styryl)arylene derivatives (DPVBi), silole derivatives having a benzene ring in their skeleton (2PSP), oxodiazole derivatives having triphenyl amine structures at the two ends (EM2), perinone derivatives having a phenanthrene group (P1), oligothiophene derivatives having triphenyl amine structures at the two ends (BMA-3T), perylene derivatives (tBu-PTC), tris(8-quinolynol)aluminum, polyparaphenylene vinylene derivatives, polythiophene derivatives, polyparaphenylene derivatives, polysilane derivatives and polyacetylene derivatives are desirable. The material is not limited to these, and two or more of these materials may be used together.

Next, as concrete example of the dopant material, quinacridone, coumarin 6, Nile red, rubrene, 4-(dicyanomethylene)-2-methyl-6-(para-dimethyl amino styryl)-4H-pyran (DCM), dicarbazole derivatives, porphyrin platinum complexes (PtOEP) and iridium complexes (Ir(ppy)3) are desirable. The material is not limited to these, and two or more of these materials may be used together.

The above described electron transport layer works to transport electrons that are then injected into the light emitting layer. Therefore, it is desirable for the electron transport layer to be made of an electron transport material having excellent electron mobility. Concretely, tris(8-quinolynol) aluminum, oxadiazol derivatives, silole derivatives, zinc benzothiazol complexes and basocuproine (BCP) are desirable. The material is, of course, not limited to these, and two or more of these materials may be used together.

In addition, it is desirable for the electron transport layer to contain a reducer in the above described electron transport material, so that the barrier against the cathode is lower and the electric conductivity is higher.

Concrete examples of the reducer are alkali metals, alkali earth metals, alkali metal oxides, alkali earth oxides, rare earth oxides, alkali metal halides, alkali earth halides, rare earth halides and complexes of an alkali metal and an aromatic compound.

Particularly favorable alkali metals are Cs, Li, Na and K. The material is, of course, not limited to these, and two or more of these materials may be used together. In addition, the below described materials for the electron injection layer may be used.

The above described electron injection layer is used to increase the efficiency of electron injection from the cathode to the electron transport layer. Concretely, lithium fluoride, magnesium fluoride, calcium fluoride, strontium fluoride, barium fluoride, magnesium oxide, aluminum oxide and cesium carbonate are desirable. The material is, of course, not limited to these, and two or more of these materials may be used together.

It is desirable for the above described cathode to be a conductive film having a small work function, so that the efficiency of electron injection is high. Concretely, magnesium silver alloys, aluminum lithium alloys, aluminum calcium alloys, aluminum magnesium alloys and metal calcium can be cited, but the material is not limited to these.

In addition, it is not necessary for the material of the cathode to have a low work function in the case where the provided electron transport layer contains an electron injection layer or a reduced, as described above, and thus, it is possible to use a transparent conductive film made of a general metal material or a material cited for the anode. Concretely, metals such as silver, aluminum, indium, molybdenum and nickel, alloys using these metals, two element based compounds, such as ITO, IZO or indium germanium oxide, three element based compounds, such as indium tin zinc oxide, composites having tin oxide or zinc oxide as a main component, polysilicon and amorphous silicon are desirable.

The above described protective layer is formed on top of the upper electrode and serves to prevent $H_2O$ and $O_2$ in the air from getting into the upper electrode and the organic layer located beneath the upper electrode.

Concretely, inorganic materials, such as $SiO_2$, $SiN_x$ and $Al_2O_3$, and organic materials, such as polychloropyrene, polyethylene terephthalate, polyoxymethylene, polyvinyl chloride, polyvinylidene fluoride cyanoethyl pullulan, polymethyl methacrylate, polysulfone, polycarbonate and polyimide can be cited, but the material is not limited to these.

It is desirable for the organic light emitting display device according to the present invention to use the organic light emitting elements described above for the pixels.

Here, the organic light emitting display device is a display device where organic light emitting elements are used for the pixels. Organic light emitting display devices include simple matrix organic light emitting display devices and active matrix organic light emitting display devices.

In simple matrix organic light emitting display devices, organic layers, such as a hole transport layer, a light emitting layer and an electron transport layer, are formed at a number of intersections where anode lines and cathode lines cross, so that each pixel is turned on only during the selection time in one frame period. The selection time is a time slot gained by dividing one frame period by the number of anode lines.

In active matrix organic light emitting display devices, a drive element formed of a switching element and a capacitor made of two to four thin film transistors is connected to an organic EL (electroluminescence) element for each pixel, and it is possible to turn on all of the drive elements during one frame period. Therefore, it is not necessary to increase the brightness, and it becomes possible to prolong the life of the organic light emitting elements.

Here, a great number of pixels are arranged in a matrix on the screen of the display device, and these are minimum units for displaying letters and graphics in the display region.

In addition, sub-pixels are minimum units that further divide the pixels in display devices for color display.

General structures for color images are formed of sub-pixels for three colors: green red and blue. In addition, the display region is where an image is displayed on the display device.

First Embodiment

In the following, the first embodiment, which is the best mode for carrying out the present invention, is described.

The first embodiment shows the results of the simulation of the efficiency of light emission when the diameter of the particles in the light extraction layer varies. The simulation was found by calculating the change in the electromagnetic field over time in points in the space using a time region differential method (FDTD method). In order to reduce the load for calculation, the simulation was carried out in a two-dimensional space.

FIG. 1 is a cross sectional diagram showing the organic light emitting element according to the first embodiment of the present invention.

In FIG. 1, the organic light emitting element has a structure where a carrier transport layer, an organic layer 3, which imitates the light emitting layer, and upper transparent electrode 4 are provided on top of the lower reflective electrode 1 and the transparent electrode 2.

The index of refraction of the transparent electrode 2, the organic layer 3 and the upper transparent electrode is 2, 1.8 and 2, respectively. In addition, the film thickness is 10 nm, 200 nm and 30 nm, respectively.

Light isotropically emitted from the organic layer 3 enters into the air layer when the critical angle relative to the interface between the upper transparent electrode 4 and the air layer 5 is 34° or less, and light is totally reflected when the critical angle is 34° or higher so as to propagate through the upper transparent electrode 4 and the organic layer 3.

It is assumed that the ratio $I_{ext}$ of the amount of light emitted into the air layer to the total amount of light emitted from the organic layer is 20%. In this case, the ratio $I_{gm}$ of the amount of light that propagates through the upper transparent electrode 4 and the organic layer 3 is 80%.

FIG. 2 is a cross sectional diagram showing an organic light emitting element where a light extraction layer is provided in the structure of the organic light emitting element shown in FIG. 1.

In FIG. 2, a layer of microscopic particles 6 having a particle diameter d and an index of refraction n is provided in the interface between the upper transparent electrode 4 and the air layer 5, into which light enters, so that the layer has the thickness of one particle but is not completely filled in with the particles and is used as the light extraction layer 7.

In the following, the arrangement of the particles is described.

As shown in FIG. 2, the area where the particles are placed is 10 µm. The area is divided with intervals of d starting from an end. Whether or not a particle is placed in the $i^{th}$ area is determined using a table of random numbers of 0 or 1, and in the case a particle is placed, it is placed at random within the range of ±10% from the center of the area. The total number of particles is determined by the below described filling factor and the average index of refraction.

In the simulation, the ratio $\eta_{np}$ of the amount of light $I_{gm}$ which propagates from the center of the organic layer 3 in the direction horizontal to the surface of the paper and is emitted from the light extraction layer 7 is calculated. The efficiency of light emission $\eta_{ext}$ is defined by the formula (1).

$$\eta_{ext}=(I_{ext}+\eta_{np}\times I_{gm})/I_{ext} \quad (1)$$

Figures 3, 4:
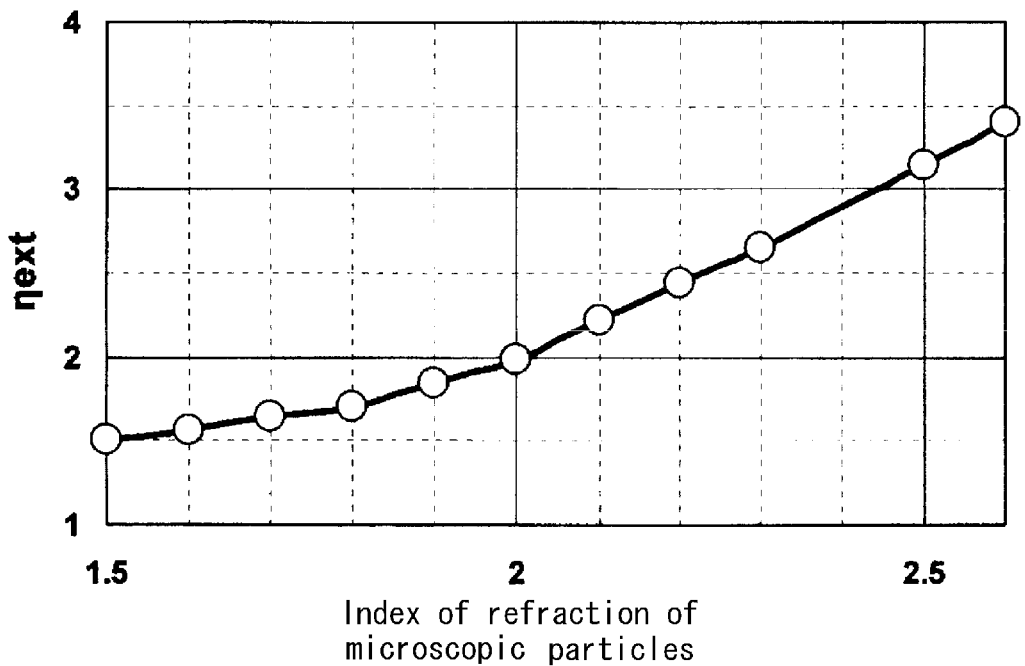
FIG. 3 is a graph showing the dependency of the efficiency of light emission on the index of refraction of the microscopic particles.
FIG. 4 is a table showing the dependency of the efficiency of light emission on the index of refraction of the microscopic particles and the filling factor of the microscopic particles.

FIG. 3 shows an example of the result of the simulation. The wavelength of the emitted light is 500 nm. The particle diameter d of the microscopic particles is fixed to 100 nm and the filling factor is 39%. The filling factor is the ratio of the area of d (height)×10 µm occupied by all the particles in the light extraction layer 7.

This simulation relates to an area ratio. The actual system is three-dimensional, and therefore, relates to a volume ratio. $\eta_{ext}$ of microscopic particles having an index of refraction of 1.5 is less than 1.5, and $\eta_{ext}$ increases as the index of refraction becomes greater in such a manner that the efficiency of light emission for microscopic particles having an index of refraction of 2.6 is increased to 3.4 times greater.

Next, FIG. 4 shows the dependency of the efficiency of light emission on the index of refraction of the particles and the filling factor when the wavelength of the emitted light is 500 nm and the particle diameter of the microscopic particles is 100 nm. This is how the table is to be interpreted. The value shown in a column where the index of refraction of the particles is 2 and the filling factor is 39% is an average index of refraction, which is 1.39. The columns lightly shaded show the results where the efficiency of light emission is two to three times higher, and the columns darkly shaded show the results where the efficiency is three or more times higher.

It can be seen from FIG. 4 that the index of refraction of particles needs to be 2 or greater in order to achieve the efficiency of light emission, which is two times or higher. This means that light is effectively scattered into the air layer when the difference in the index of refraction between the particles and the air is 1 or greater.

Next, it can be seen that the average index of refraction needs to be 1.4 or greater.

In general light guiding paths, guided light exudes into the clad layer in accordance with the index of refraction of the clad layer (Reference Document: "Optical Integrated Circuit," by Hiroshi Nishihara, Masamitsu Haruna and Toshiaki Sumihara, published by Ohmsha, Ltd., 1985, chapter 2•2).

According to the reference document, the exuding distance is 80 nm when the wavelength of emitted light is 500 nm, the index of refraction of the clad layer is 1.4, the core thickness is 300 nm, the index of refraction of the core is 1.8, and the scale of asymmetry is 0.

According to the results of the simulation, the efficiency of light emission does not reach two times higher irrespective of the filling factor, that is to say, the average index of refraction, when microscopic particles having an index of refraction of the particles of 2.6 and a particle diameter of 50 nm are used. This means that it is necessary for the particle diameter of microscopic particles that form the light extraction layer to take a value which is the same as or greater than that of the exuding distance when the average index of refraction is 1.4.

Patent Document 1 describes a structure where a host material having a low index of refraction of 1.1 to 1.9 contains microscopic particles. Meanwhile, the present invention provides a structure where microscopic particles having an index of refraction of 2 or greater are aligned with high density, and thus, the structures are different.

Though described in the second embodiment, in some cases a support body is added in order to enhance the adhesion of microscopic particles, and the volume ratio thereof is several % or less. In addition, in Patent Document 1 the region from which light is emitted is made of a host material having a low refraction or a medium having an index of refraction that is the same as or greater than that of the host material, whereas in the First Embodiment, light is emitted into the air layer.

As a result of the above, the present invention is different from the invention in Patent Document 1.

Second Embodiment

In the following, the second embodiment, which is the best mode for carrying out the present invention, is described.

The second embodiment is characterized in that a light extraction layer using microscopic particles of titania is formed in a top anode type organic light emitting element.

Figure 5:
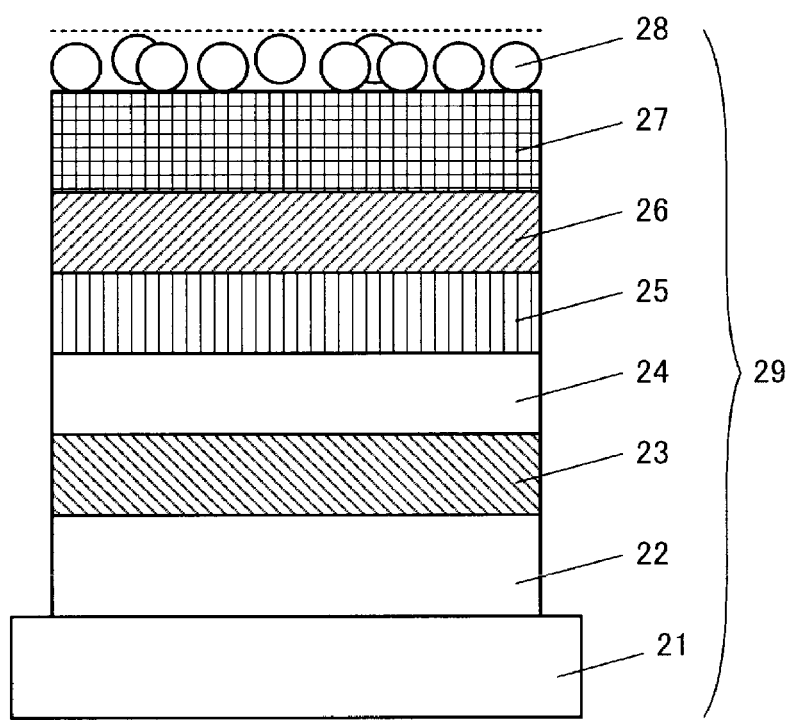
FIG. 5 is a cross sectional diagram showing an organic light emitting element.

FIG. 5 is a cross sectional diagram showing the organic light emitting element according to the second embodiment of the present invention.

In FIG. 5, the organic light emitting element has a first electrode 22 which functions as a reflective film, an electron transport layer 23, a light extraction layer 24, a hole transport layer 25, a hold injection layer 26 and a second electrode 27 which is a transparent electrode on top of a glass substrate 21, and thus, has a structure where a light extraction layer 28 is formed on the second electrode 27.

Here, the manufacturing method for an organic light emitting element according to the second embodiment illustrated in FIG. 5 is described.

An Ag film having a thickness of 150 nm and an IZO film having a thickness of 20 nm are formed on a glass substrate 21 in accordance with a sputtering method. The Ag film and the IZO film are patterned in accordance with a photolithographic process, and thus, a first electrode 22 (reflective film) is gained.

Next, a tris(8-quinolinol) aluminum film having a film thickness of 20 nm (hereinafter referred to as "Alq$_3$") is formed as an electron transport layer 23 in accordance with a vacuum vapor deposition method.

On top of this, a film having a thickness of 40 nm made of 4,4'-N,N'-dicarbazole-biphenyl (hereinafter referred to as "CBP") and an iridium complex (hereinafter referred to as "Ir(ppy)$_3$") vapor deposited at the same time is formed as a light emitting layer 24 in accordance with a vacuum vapor deposition method carried out on the two elements simultaneously. The rate of the vapor deposition is controlled to 100:7.5.

A 4,4'-bis[N-(1-naphthyl)-N-phenyl amino]biphenyl film having a film thickness of 50 nm (hereinafter referred to as α-NPD) is formed on the light emitting layer 24 as a hole transport layer 25 in accordance with a vapor deposition method.

On top of this, a copper phthalocyanine layer having a film thickness of 50 nm is formed as a hole injection layer 26 in accordance with a vacuum vapor deposition method.

On top of that, an In—Zn—O film having a film thickness of 100 nm (hereinafter abbreviated as IZO film) is formed in accordance with a sputtering method. A target where In/(In+Zn)=0.83 is used.

As for the conditions for film formation, the degree of vacuum is 0.8 Pa where the atmosphere is a mixture of Ar and O$_2$ and the output for sputtering is 0.2 W/cm$^2$. This IZO film is an amorphous oxide film and functions as a second electrode 27 (transparent electrode).

A light extraction layer is formed on top of the second electrode 7. This is formed in accordance with a spin coating method using an isopropyl alcohol (IPA) solution where titania particles and silica sol are dispersed. The concentration of the titania particles and the silica sol is 2.2 wt % and 0.3 wt %, respectively. The conditions for fabrication in accordance with a spin coating method are 120 rpm×30 seconds. The average particle diameter of titania is determined as 150 nm using a dynamic scattering method. Through the observation of the surface of the light extraction layer using a SEM, it can be confirmed that titania particles having an average particle diameter of 150 nm are aligned aperiodically. The average index of refraction of the light extraction layer 28 is 1.4. As a result, an OLED substrate 29 is formed.

Next, the OLED substrate 29 is pasted to a facing substrate made of glass (not shown). A photo-curing resin is applied to the edges of the facing substrate, which is pasted to the OLED substrate 29, and the two are pressed against each other in a high dew point atmosphere, and the facing substrate side is irradiated with UV rays so that the photo-curing resin is cured.

In the second embodiment, titania particles in spherical form are used for the microscopic particles that form the light extraction layer. As described above, it is desirable for the index of refraction of the microscopic particles to be 2 or higher. Concretely, sulfides, such as zirconia, barium titanate and ZnS, can be cited, but there is no particular limitation. The particles may be in pillar form, needle form or rod form instead of in spherical form. It is preferable for the average index of refraction of the light extraction layer to be 1.4 or higher. It is particularly desirable for it to be 1.7 to 1.8 or higher, which is equal to the index of refraction of the organic layer that forms the organic light emitting element.

Though in the second embodiment, a spin coating method is used as the method for manufacturing a light extraction layer, other conventional application methods, such as dip coating, bar coating and spray coating, can be used. It is preferable for the atmosphere at the time of application not to include oxygen and moisture. This is because oxygen and moisture cause dark spots to grow in the OLED. It is preferable to carry out one continuous operation for application, baking and sealing in the above described atmosphere. The purpose of baking after the application is to polymerize the support body through heating, and it is preferable for the temperature to be 120° C. or less, taking the heat resistance of the OLED into consideration.

The silica sol used in the second embodiment is gained by heating alkoxysilane in acidic water with diluted hydrochloride acid, diluted nitric acid or diluted phosphoric acid, or in a mixed liquid of water and alcohol so that the alkoxysilane polymerizes so as to have a molecular weight of several thousands.

As the alkoxysilane, methyltrimethoxysilane, ethyltrimethoxysilane, butyltrimethoxysilane, tetramethoxysilane and tetraethoxysilane can be cited.

Here, alkoxy titanium may be used instead of alkoxy silane if it is compatible with the liquid properties and the solvent.

As the alkoxy titanium, tetra-i-propyl titanate, tetra-n-butyl titanate, tetra stearyl titanate, triethanol amine titanate, titanium acetylacetonate, titanium ethyl acetoacetate, titanium lactate and tetra octylene glycol titanate can be cited.

In addition, it is possible to use substances where several molecules of these compounds are polymerized.

Incidentally, the same support performance as the above described silica sol can be gained when alkoxy silane having an amino group is used instead of silica sol. In addition, when it is exposed to an acid gas atmosphere, the amino group is converted to an ammonium salt structure, and as a result, it is possible to further increase the hydrophilicity of the film.

As for these materials, N-(2-amino ethyl)-3-amino propyl methyl dimethoxy silane, 3-amino propyl triethoxy silane and 3-amino propyl trimethoxy silane can be cited.

The brightness in the frond direction, the current density-voltage properties and angular dependency on the deflection angle of the EL spectrum radiation pattern are measured for the optical light emitting element formed in accordance with the above described method, and an organic light emitting element where no light extraction layer 28 is provided, and thus, the quantum efficiency is calculated.

As a result, the efficiency of light emission increases to 2.1 times higher than in the element where no light extraction layer is layered.

As shown in the second embodiment, the average index of refraction of the light extraction layer is 1.4, and therefore, the exuding distance is 80 nm. The average particle diameter of the titania particles used in the light extraction layer in the second embodiment is 150 nm, and therefore, it is possible to scatter light in the exuding region so that light emits into the air layer.

In the second embodiment, silica sol is added in order to increase the adhesion between titania particles. It is found through observation using a SEM that the silica sol has a thickness of approximately several nm and coats the titania particles.

The index of refraction of the silica sol is approximately 1.5. No difference in the efficiency of light emission is permitted through simulation, depending upon whether or not there is silica sol, and as a consequence, the efficiency of light emission is not affected in the second embodiment.

Third Embodiment

In the following, the third embodiment, which is the best mode for carrying out the invention, is described.

The third embodiment is characterized by the use of a light extraction layer having microscopic particles with different average particle diameters.

Figure 6:
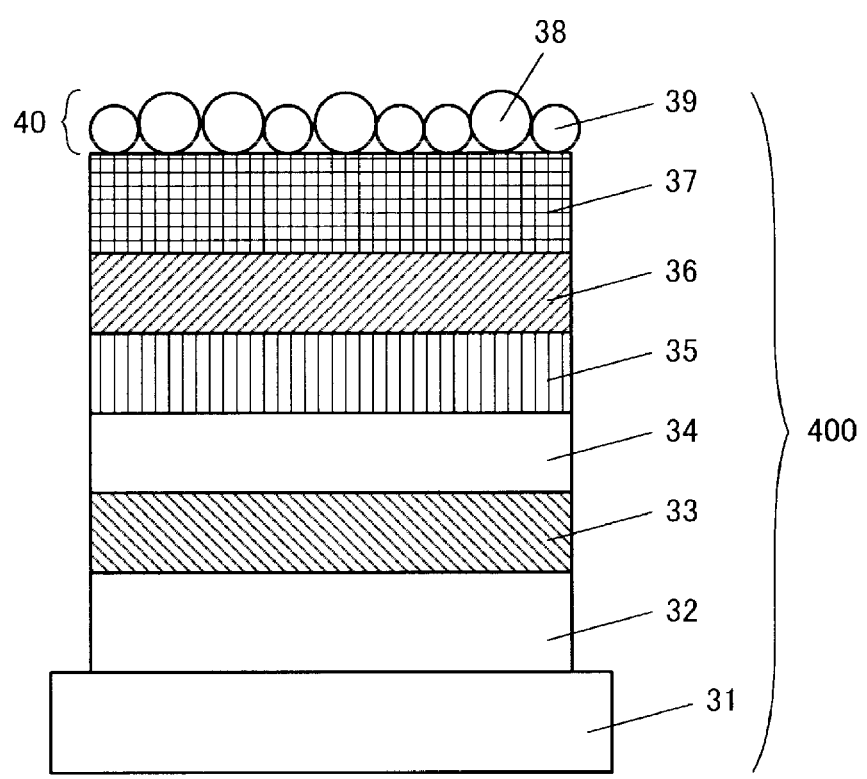
FIG. 6 is a cross sectional diagram showing another organic light emitting element.

FIG. 6 is a cross sectional diagram showing the organic light emitting element according to the third embodiment of the present invention.

In FIG. 6, the organic light emitting element according to the third embodiment has a first electrode 32, an electron transport layer 33, a light emitting layer 34, a hole transport layer 35, a hole injection layer 36 and a second electrode 37 formed on top of a glass substrate 31. The conditions for fabricating an organic light emitting element according to the third embodiment are the same as in the second embodiment.

Alight extraction layer 40 is formed on top of the second electrode 37. This is formed in accordance with a spin coating method using an IPA solution where titania particles having two different average particle diameters and silica sol are dispersed.

The concentration of the titania particles and the silica sol is 2.2 wt % and 0.3 wt %, respectively. The average particle diameter of the titania particles is 100 nm and 150 nm. The conditions for fabricating the light extraction layer in accordance with the spin coating method are the same as in the second embodiment. Through observation using a SEM, microscopic particles having an average particle diameter of 100 nm and microscopic particles having an average particle diameter of 150 nm are aligned aperiodically on the surface of the light extraction layer.

The method for sealing the space between the OLED substrate 400 and the facing substrate is the same as in the second embodiment.

In the third embodiment, the average index of refraction in a portion at a distance of 100 nm from the interface between the second electrode and the light extraction layer 40 is 1.9. This value is close to the index of refraction of the second electrode 37 and the organic layers 33 through 36, and therefore, the light guided through the OLED propagates through the light extraction layer, is scattered by the microscopic titania particles, and emits into the air layer. The efficiency of light emission is increased to 3.1 times higher.

Fourth Embodiment

In the following, the fourth embodiment, which is the best mode for carrying out the present invention, is described.

The fourth embodiment is characterized by the use of a light extraction layer having microscopic titania particles with a particle diameter of 50 nm or less.

Figure 7:
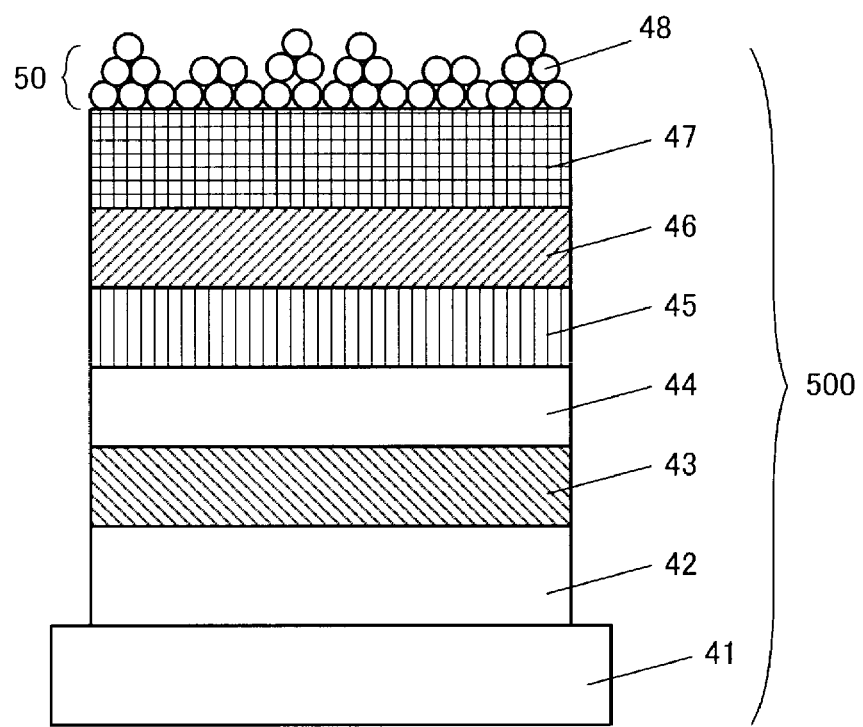
FIG. 7 is a cross sectional diagram showing still another organic light emitting element.

FIG. 7 is a cross sectional diagram showing the organic light emitting element according to the fourth embodiment of the present invention.

In FIG. 7, the organic light emitting element according to the fourth embodiment has a first electrode 42, an electron transport layer 43, a light emitting layer 44, a hole transport layer 45, a hole injection layer 46 and a second electrode 47 formed on top of a glass substrate 41. The conditions for fabricating the organic light emitting element according to the fourth embodiment are the same as in the second embodiment.

Alight extraction layer 50 is formed on top of the second electrode 47. This is formed in accordance with a spin coating method using pure water where titania particles having a particle diameter of 20 nm to 50 nm and polyvinyl alcohol are dispersed. The concentration of the titania particles and the silica sol is 2.0 wt % and 0.3 wt %, respectively. The conditions for fabricating the light extraction layer in accordance with a spin coating method are the same as in the second embodiment.

Finally, the space between the OLED substrate 500 and the facing substrate is sealed. The conditions for sealing are the same as in the second embodiment.

Through observation using a SEM, the light extraction layer has a structure with islands having an average height of 150 nm on the surface. The average index of refraction of the light extraction layer 50 is 1.5. The efficiency of light emission is 2.1 times higher than that of elements without a light extraction layer.

The distance over which light exudes into the light extraction layer from the interface between the second electrode and the light extraction layer 50 is 80 nm, as in the second embodiment. Microscopic particles are aligned in the light extraction layer in this region, and light is scattered due to the difference being 1.6 in the index of refraction between the microscopic particles and the air and enters into the air layer, and thus, it is considered that the efficiency of light emission increases.

Fifth Embodiment

In the following, the organic light emitting display device according to the fifth embodiment, which is the best mode of the present invention, is described.

Figure 8:
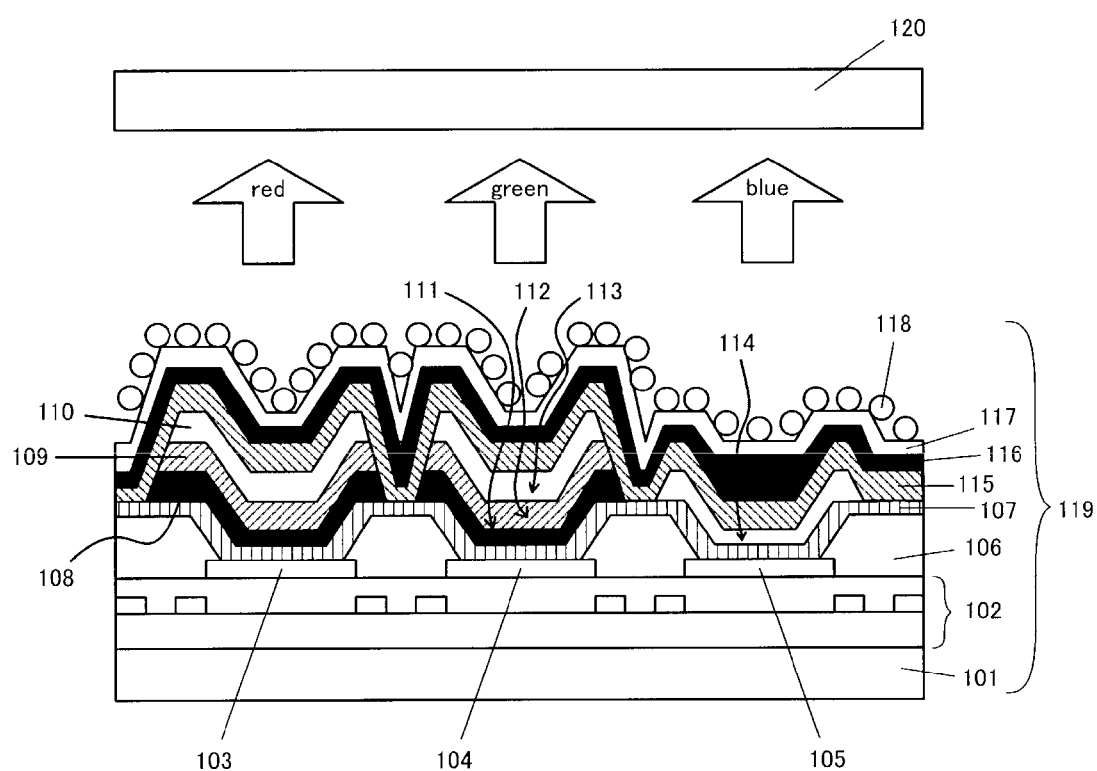
FIG. 8 is a cross sectional diagram showing an organic light emitting display device.

FIG. 8 is a cross sectional diagram showing pixels of the organic light emitting display device according to the fifth embodiment of the present invention.

Though not shown in FIG. 8, a drive layer 102 is formed between the glass substrate 101 and the lower electrodes 103, 104 and 105 of the organic light emitting elements.

In the drive layer, a number of scan lines are provided at constant intervals, and at the same time, signal lines for conveying image information are provided at constant intervals in the direction which crosses the scan lines.

That is to say, the scan lines and the signal lines are arranged in a grid form so that the regions surrounded by the scan lines and the signal lines are display regions for one pixel or for one sub-pixel.

Furthermore, a number of first current supply lines connected to the power supply are provided on the glass substrate so as to be parallel to the signal lines.

The scan lines, the signal lines and the first current supply lines are formed on the glass substrate via interlayer insulating films as wires belonging to wire layers.

A number of organic light emitting elements, which form pixels as minimum units for a color image, are provided on the upper side of the drive layer.

The lower electrodes 103, 104 and 105 are formed so as to have the same sides as the sub-pixels.

On top of this, organic layers, including hole transport layer 107, 108 and 111, light emitting layer 109, 112 and 114, electron transport layer 110, 113 and 115, and an upper electrode 116, are formed in the structure.

The lower electrodes 103 to 105 of the organic light emitting elements belonging to the respective pixels are connected to the first current supply line via second transistors, which are described below as drive elements, while the upper electrode 116 of the organic light emitting elements belonging to the respective pixels is connected to the power supply.

In addition, a drive layer for driving the organic layers in the respective pixels is formed on top of the glass substrate 101.

This drive layer is formed of first transistors, second transistors and capacitors, which are drive elements.

The gate electrode of a first transistor is connected to a scan line, the source electrode is connected to a signal line, and the drain electrode is connected to the gate electrode of a second transistor and the lower electrode of a capacitor.

The drain electrode of a second transistor is connected to the upper electrode of a capacitor and a first current supply line, and the source electrode is connected to a lower electrode 103 to 105.

Next, the structure of the organic light emitting elements that are pixels is described in reference to FIG. 8.

Lower electrodes 103 to 105 are formed of Ag or IZO on top of the drive layer 102 in accordance with a sputtering method.

The film thickness of the drive layer is 150 nm, and the film thickness of the lower electrodes is 20 nm.

Next, an interlayer insulating film 106 is formed so as to cover the edges of the lower electrodes. In the present embodiment, a polyimide insulating film is used for the interlayer insulating film 106, but the invention is not limited to this, and organic insulating materials, such as polychloropyrene, polyethylene terephthalate, polyoxymethylene, polyvinyl chloride, polyvinylidene, cyanoethyl pullulan, polymethyl methacrylate, polysulfone, polycarbonate and acryl, can be cited.

In addition, it is also possible to use inorganic materials, such as $SiO_2$, $SiN_x$ and $Al_2O_3$. In addition, a structure where an inorganic insulating film is layered on top of an organic insulating film is also possible.

Next, a film of α-NPD having a film thickness of 20 nm is formed on top of the lower electrodes 103 to 105 in accordance with a vacuum vapor deposition method. This vapor deposition film is formed on the entire surface of the light emitting display area and functions as a hole transport layer 107.

Next, the formation of organic layers in sub-pixels for red light emission (hereinafter referred to as "R sub-pixels") is described.

An α-NPD film 108 having a film thickness of 20 nm is formed on the α-NPD film 107 in accordance with a vacuum vapor deposition method. This is formed as described below in order to adjust the conditions for light interference in the R sub-pixels.

A film is formed by vapor depositing CBP and bis[2-(2'-benzo[4,5-a]thienyl)piridinate-N,C3']iridium(acetylacetonate) (hereinafter referred to as "$Brp_2Ir(acac)$") together.

The rate of vapor deposition of the CBP and the $Brp_2Ir$(acac) is 0.20 nm/sec and 0.02 nm/sec, respectively.

The above described film where two substances are vapor deposited together functions as an R light extraction layer 109.

In addition, $Brp_2Ir$(acac) in the R light extraction layer 109 functions as an emitter which determines the color of the emitted light. On top of this, a film 110 having a film thickness of 45 nm is formed through vapor deposition of $Alq_3$. This vapor deposition film functions as an electron transport layer.

In addition, the $Alq_3$ film 110 is provided to adjust the conditions for optical interference. The α-NPD film 108, the film where CBP and $Brp_2Ir$(acac) are vapor deposited together, and the $Alq_3$ film 110 are patterned using a precision mask having openings with the same size as the sub-pixels.

Next, the formation of an organic layer in sub-pixels for green light emission (hereinafter referred to as "G sub-pixels") on the lower electrode 104 is described.

An α-NPD film 111 having a film thickness of 10 nm is formed on the α-NPD film 107 in accordance with a vacuum vapor deposition method. On top of this, a film where CBP and $Ir(ppy)_3$ are vapor deposited together with a film thickness of 40 nm is formed in accordance with a vacuum vapor deposition method.

The rate of vapor deposition for CBP and $Ir(ppy)_3$ is 0.20 nm/sec and 0.02 nm/sec, respectively.

The above described film where the two elements are vapor deposited together functions as a G light emitting layer 112.

In addition, $Ir(ppy)_3$ functions as an emitter for determining the color of light emission in the G light emitting layer. An $Alq_3$ vapor deposition film 113 having a film thickness of 20 nm is formed on top of this.

The α-NPD film 111 and the $Alq_3$ film 113 are provided in order to adjust the conditions for the light interface in G sub-pixels. In addition, the α-NPD film 111, the film 112 where CBP and $Ir(ppy)_3$ are vapor deposited together, and the $Alq_3$ film 113 are patterned using a precision mask having a pattern with openings of the same size as the sub-pixels.

Next, the formation of an organic layer in sub-pixels for blue light emission (hereinafter referred to as "B sub-pixels") on the lower electrode 105 is described.

A film 114 having a thickness of 40 nm where 9,10-di-(2-naphthyl)anthracene (hereinafter referred to as "ADN") and 2,5,8,11-tetra-t-butyl perylene (hereinafter referred to as "TBP") are vapor deposited together is formed on the α-NPD film 107 in accordance with a vacuum vapor deposition method.

The rate of vapor deposition for the ADN and the TBP is 0.20 nm/sec and 0.01 nm/sec, respectively. The film 114 where the ADN and the TBP are vapor deposited together is patterned using a precision mask having a pattern with openings of the same size as the sub-pixels.

Next, an $Alq_3$ vapor deposition film 115 having a film thickness of 60 nm is formed for R sub-pixels, G sub-pixels and B sub-pixels in accordance with vacuum vapor deposition. This $Alq_3$ vapor deposition film 115 functions as an electron transport layer.

Next, CuPc is formed to a film thickness of 2 nm on top of the $Alq_3$ vapor deposition film 115 in accordance with a vacuum vapor deposition method, and an IZO film is formed to a thickness of 40 nm in accordance with a sputtering method. These films are formed over the entire surface of the luminous display area, and function as an upper transparent electrode 116.

A protective film 117 is formed on top of the upper transparent electrode 116. As the protective film 117, an $SiN_x$ film having a film thickness of 50 nm is formed in accordance with an ion plating method.

Though in the fifth embodiment, the protective film is fabricated in accordance with an ion plating method, a low temperature film formation method, for example a reactive plasma method, may be used. In addition, a silicon nitride oxide film may be used instead of an $SiN_x$ film in the fifth embodiment.

A light extraction layer 118 is formed on top of this. The method for forming it is the same as in the second embodiment. As a result, the OLED substrate 119 is completed.

After that, the OLED substrate 119 and a facing substrate 120 are pasted together and the space in between is sealed. The method for forming this is the same as in the second embodiment. As a result, the organic light emitting display device is completed.

The distance over which red emitted light and blue emitted light exude is 100 nm and 70 nm, respectively, and the efficiency of light emission from a light extraction layer 118 where titania particles having an average particle diameter of 150 nm are used is high.

The efficiency of light emission from the red pixels, the green pixels and the blue pixels is 2 times higher, 2.2 times higher and 2.5 times higher in the organic light emitting display device according to the fifth embodiment than in organic light emitting display devices where no light extraction layer 118 is provided.

Sixth Embodiment

In the following, the organic light emitting display device according to the sixth embodiment, which is another best mode of the present invention, is described.

The organic light emitting display device according to the sixth embodiment of the present invention has a structure where an OLED substrate and a facing substrate make contact with each other, and in this structure, a second light extraction layer is provided between the OLED substrate and the facing substrate.

Figure 9:
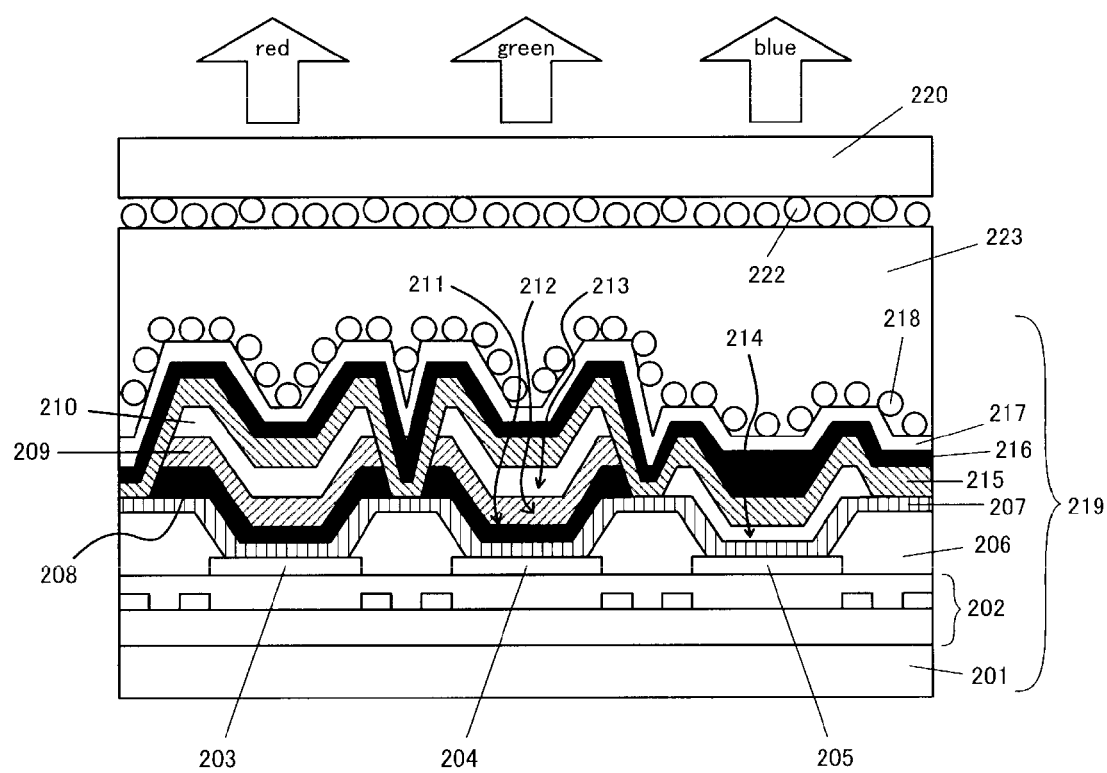
FIG. 9 is a cross sectional diagram showing another organic light emitting display device.

FIG. 9 is a cross sectional diagram showing pixels in the organic light emitting display device according to the sixth embodiment of the present invention.

The conditions for fabricating an organic light emitting element in FIG. 9, where a drive layer 202, an R sub-pixel, a G sub-pixel and a B sub-pixel are formed on a glass substrate 201, are the same as in the fifth embodiment. A protective film 217 is formed on top of the upper transparent electrode 216, which is a common electrode for the sub-pixels. The conditions for fabricating this are the same as in the fifth embodiment.

Next, a light extraction layer 218 is formed on top of the protective film 217. The conditions for fabricating the light extraction layer are the same as in the fifth embodiment.

As a result, the OLED substrate 219 is completed.

Next, a method for fabricating a facing substrate is described.

A second light extraction layer 222 is formed on a glass substrate 220, which is a facing substrate. A silane coupling agent having an alkyl group or a phenyl group at one terminal is combined on the surface of particles having an index of refraction of approximately 1.8, in order to improve the dispersion in alcohol based organic solvents. As concerns the type of particles, alumina is possible.

Next, the particles are dispersed in an alcohol based solvent, and approximately 1% to 2% of silica sol as relative to the volume of the particles is added as a binder.

Thus, a paint for forming a light extraction layer having a low index of refraction is prepared.

This paint is applied on the surface of the transparent electrode through spin coating. When the solvent evaporates, the particles remain on the surface of the transparent electrode, and thus, a light extraction layer having a desired, low index of refraction is formed.

The filling factor of the particles in the light extraction layer having a low index of refraction can be made approximately 50% by adjusting the concentration of the paint and the conditions for application so that the light extraction layer having a low index of refraction becomes approximately half of the average particle diameter.

A thermosetting resin is applied over the entire surface of the second light extraction layer 222. The OLED substrate 219 and the facing substrate 220 are pasted together, and the thermosetting resin is cured at 100° C., so that the OLED substrate 219 and the facing substrate 220 make contact with each other.

In the sixth embodiment, a glass substrate is used as the facing substrate. Organic layers for conventional organic light emitting elements easily deteriorate due to moisture in the air. Therefore, as other materials for the facing substrate 219, a polymer film on which a gas barrier process is carried out and a multilayer body of a thin glass plate and a resin film can be used.

As the polymer film, a polycarbonate film formed in accordance with a casting method, a polymer film, such as a triacetyl cellulose film, an optically isotropic plastic sheet, or a plastic film, such as an alicyclic acryl resin formed through injection molding, can be used.

Here, in the case where a polymer film or a resin plate is used, it is necessary to carry out a gas barrier process, for example form a gas barrier layer, or provide gas barrier properties by pasting a material with glass having a thickness of approximately several tens of μm.

Though in the sixth embodiment, a thermosetting resin is used for the adhesive layer, any well known material, such as polyester resin, acryl resin, polycarbonate, PMMA or hydrocarbon based resin, such as polyethylene or polypropylene, can be used.

In the sixth embodiment, the efficiency of light emission from the upper transparent electrode 216 and the protective film 217 increases because of the light extraction layer 218, as in the second embodiment.

However, the light extraction layer 218 makes contact with the thermosetting resin layer 223. The index of refraction of the thermosetting resin layer 223 is approximately 1.5. Therefore, it is possible for emitted light to propagate only through the medium having an index of refraction of 1.5.

Therefore, there is total reflection in the interface between the facing substrate 220 and the air layer in structures where there is no second light extraction layer, and thus, no increase can be expected in the efficiency of light emission.

In the sixth embodiment, the average index of refraction of the second light extraction layer 222 is 1.5, which is approximately the same as the index of refraction of the thermosetting resin layer. Therefore, light propagates through the second light extraction layer 222. In the case where the average index of refraction of the second light extraction layer is less than 1.5, for example 1.4, some light exudes on the second light extraction layer side from the interface between the thermosetting resin layer 223 and the second light extraction layer 222, and is emitted into the air layer, as a result of the below described mechanism. However, light reflected from the interface between the thermosetting resin layer 223 and the second light extraction layer 222 is reflected from the protective film 217, because the film thickness of the thermosetting resin layer 223 is several μm to several tens of μm, so that the point at which the light reaches the interface again is at a distance of several μm or more, which leads to blurring of the pixels, making adjacent pixels appear to emit light. Therefore, it is necessary for the average index of refraction of the second light extraction layer 222 to be approximately the same as the index of refraction of the thermosetting resin layer.

The second light extraction layer 222 is a layer where microscopic particles having an index of refraction of 1.8 and air are mixed, and therefore, light scattered by the microscopic particles is emitted into the air layer. Therefore, there is no total reflection from the interface between the facing substrate 220 and the air layer, and thus, the efficiency of light emission increases.

The brightness in the front direction, the current density-voltage properties, and the angular dependency of EL spectrum radiation pattern on the deflection angle for a constant current are measured, and the quantum efficiency is calculated. As a result, the efficiency of light emission is 2.1 times higher than elements where no light extraction layer is provided.

In the sixth embodiment, the light extraction layer 218 and the thermosetting resin layer 223 make contact, and this can be regarded as a structure where titania particles are dispersed in the thermosetting resin layer, and this structure is close to that in Patent Document 1.

In Patent Document 1, however, a layer with a low index of refraction, where the average index of refraction is 1.01 to 1.3, is used so that light emits into the air layer. In the sixth embodiment, a second light extraction layer having an average index of refraction of 1.5 is used, and thus, a structure where there is no total reflection form the interface between the thermosetting resin layer 223 and the second light extraction layer 222 is provided, and thus, the invention is different.

Seventh Embodiment

In the following, the organic light emitting display device according to the seventh embodiment, which is another best mode for the present invention, is described.

The organic light emitting display device according to the seventh embodiment of the present invention has a structure where an OLED substrate and a facing substrate make contact with each other, and a second light extraction layer is provided on the light emitting surface of the facing substrate.

Figure 10:
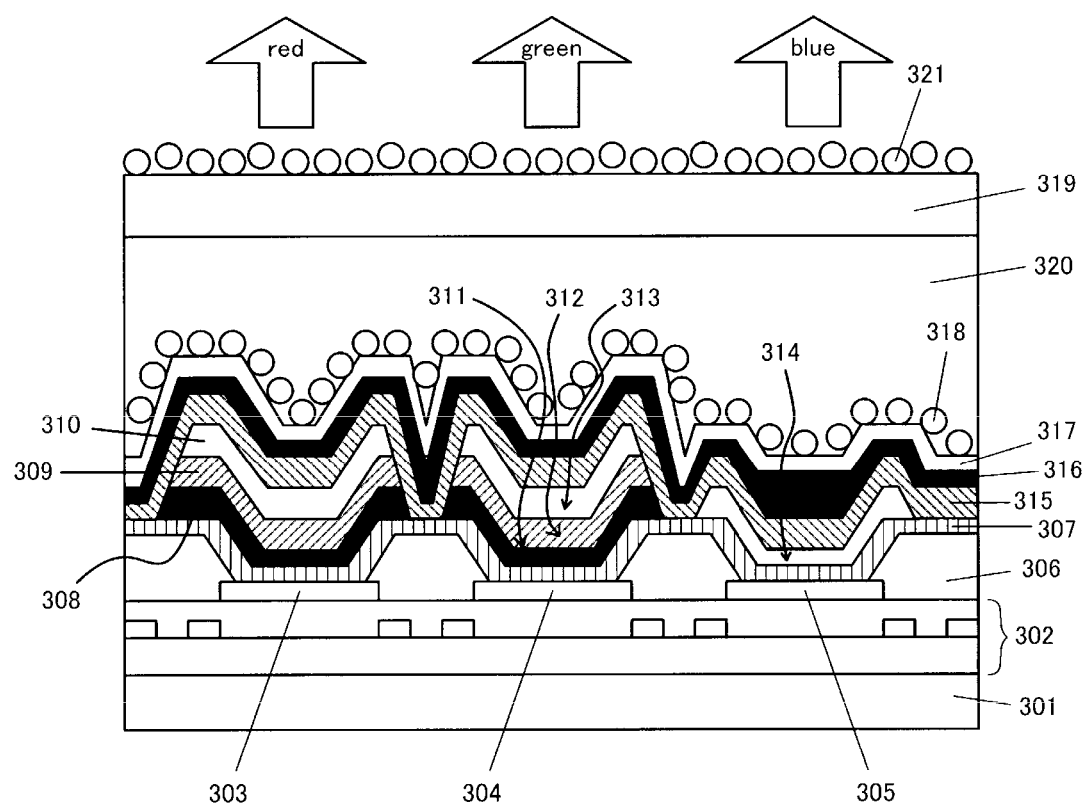
FIG. 10 is a cross sectional diagram showing still another organic light emitting display device.

FIG. 10 is a cross sectional diagram showing pixels of the organic light emitting display device according to the seventh embodiment of the present invention.

The conditions for fabricating a drive layer 302, organic light emitting elements for forming R sub-pixels, G sub-pixels and B sub-pixels, a protective film 317 and a light extraction layer 318 on a glass substrate 301 in FIG. 10 are the same as in the fifth embodiment.

Next, a method for fabricating a facing substrate for the organic light emitting display device according to the seventh embodiment is described.

A second light extraction layer 321 is formed on the glass substrate 319, which is a facing substrate. The conditions for fabricating the second light extraction layer 321 are the same as in the sixth embodiment.

In addition, the below described technique can be cited as a method for forming the second light extraction layer 321 in another embodiment. A silane coupling agent having an alkyl group or a phenyl group at one terminal is combined on the surface of particles having an index of refraction of approximately 1.8, in order to improve the dispersion in alcohol based organic solvents. As concerns the type of particles, alumina is possible.

Next, particles are dispersed in t-butanol, and 1% to 2% of silica sol as relative to the volume of the particles is added as a binder. Thus, a paint for forming a light extraction layer having a low index of refraction is prepared.

Here, t-butanol has a melt point of approximately 25° C., and therefore, is heated to approximately 30° C. before being applied. In addition, the OLED elements are cooled to 10° C. or less. The t-butanol, which is a solvent, is solidified after application, and forms a film where particles and a solvent are mixed together.

When the OLED elements are heated under reduced pressure in this state, the t-butanol evaporates, and only the particles held in the transparent electrode by means of the binder remain. Thus, a light extraction layer having a desired, low index of refraction is formed.

The filling factor of the particles in the light extraction layer having a low index of refraction can be made approximately 50% by adjusting the concentration of the paint and the conditions for application so that the light extraction layer having a low index of refraction becomes approximately half of the average particle diameter.

In the seventh embodiment, the efficiency of light emission from the upper transparent electrode 316 and the protective film 317 into the thermosetting resin layer 320 having an index of refraction of 1.5 and the facing substrate 319 can be increased by means of the light extraction layer 316, as in the sixth embodiment.

The average index of refraction of the second light extraction layer is 1.5, and therefore, light propagates through the second light extraction layer. The second light extraction layer is a layer where microscopic particles having an index of refraction of 1.8 and air are mixed, and therefore, light scattered by the microscopic particles is emitted into the air layer, and thus, the efficiency of light emission increases.

The brightness in the front direction, the current density-voltage properties, and the angular dependency of EL spectrum radiation pattern on the deflection angle for a constant current are measured, and the quantum efficiency is calculated. As a result, the efficiency of light emission is 2.1 times higher than elements where no light extraction layer is provided.

Eighth Embodiment

In the following, the organic light emitting display device according to the eighth embodiment, which is another best mode for the present invention, is described.

The organic light emitting display device according to the eighth embodiment of the present invention has a structure where an OLED substrate and a facing substrate make contact with each other, and the structure provides a second light extraction layer in the OLED substrate and the facing substrate.

Figure 11:
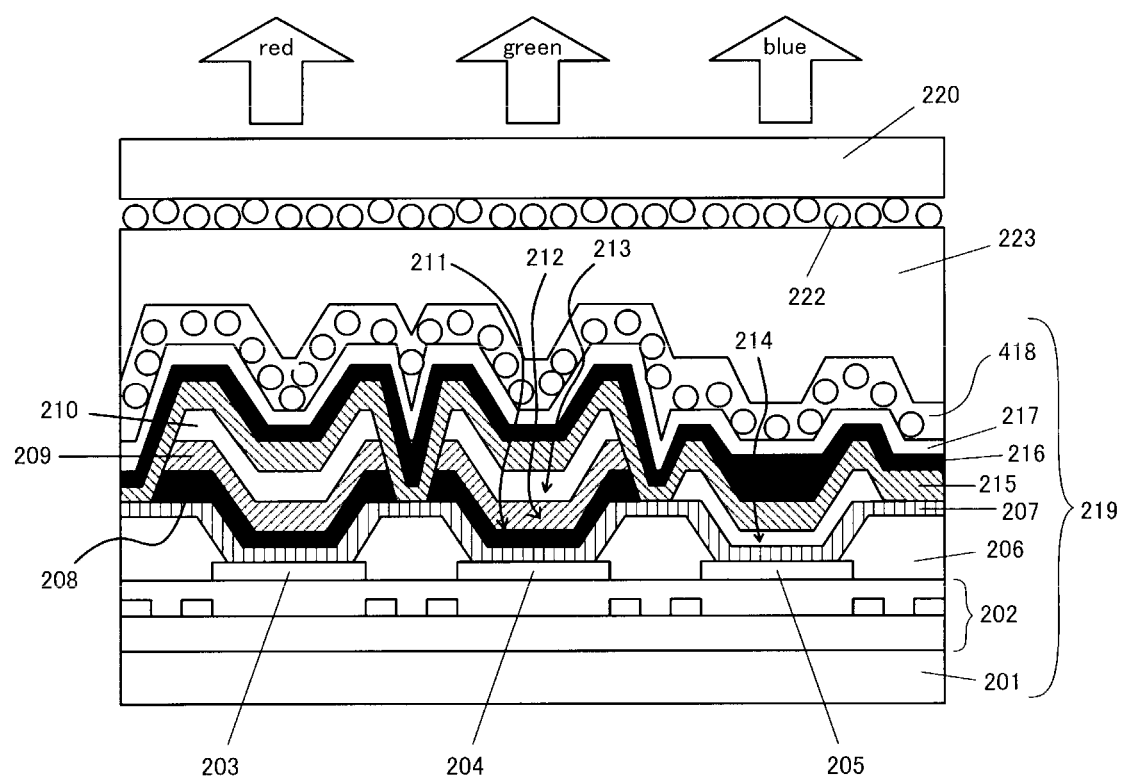
FIG. 11 is a cross sectional diagram showing yet another organic light emitting display device.

FIG. 11 is a cross sectional diagram showing pixels in the organic light emitting display device according to the eighth embodiment of the present invention.

The conditions for fabricating a drive layer 202 and organic light emitting elements for forming R sub-pixels, G sub-pixels and B sub-pixels on a glass substrate 201 in FIG. 11 are the same as in the sixth embodiment. A protective film 217 is formed on top of an upper transparent electrode 216, which is a common electrode for the sub-pixels. The conditions for fabricating this are the same as in the sixth embodiment.

Next, a third light extraction layer 418 is formed on top of the protective film 217. In the method for forming a third light extraction layer, the following steps (1) to (3) are provided.

(1) Fabrication of Liquid in Which Polymer Particles Dispersed

A liquid in which acryl based polymer particles are dispersed is fabricated in advance using an acryl based monomer. As an example of this, a liquid in which particles of methyl methacrylate and n-hexyl acrylate are dispersed is described below.

Methyl methacrylate and n-hexyl acrylate having the same molarity are polymerized through emulsion, so that a liquid in which polymer particles made of methyl methacrylate and n-hexyl acrylate are dispersed is fabricated.

Ethyl methacrylate, propyl methacrylate, butyl methacrylate or hexyl methacrylate may be used instead of methyl methacrylate. In addition, n-octyl acrylate or n-decyl acrylate may be used instead of n-hexyl acrylate.

(2) Particles Having High Index of Refraction Processed with Silane Coupling Agent Next, a silane coupling agent having an amino group or glycidyl group at one terminal is combined on the surface of particles having an index of refraction of 2.4 or higher, in order to increase the dispersion properties in the liquid in (1). As concerns the type of particles, titanium oxide, barium titanate or zirconium oxide are possible.

(3) Formation of Light Extraction Layer

The particles having a high index of refraction fabricated in (2) are added to the liquid fabricated in (1), so that the particles disperse. At this time, the volume of the added particles and the volume of the polymer in the liquid are adjusted so as to be approximately the same.

This liquid is applied to a transparent electrode, which is after that heated so that the solvent evaporates, and then a light extraction layer where particles having a high index of refraction and portions made of an acryl resin having an index of refraction of approximately 1.5 are mixed together is formed.

As a result, the OLED substrate 219 is completed.

Next, a method for fabricating a facing substrate is described. The method for forming a second light extraction layer 222 and a thermosetting resin layer 223 on a glass substrate 220, which is the facing substrate, is the same as in the sixth embodiment.

The conditions for sealing the space between the OLED substrate 219 and the facing substrate 220 are also the same as in the sixth embodiment.

The brightness in the front direction, the current density-voltage properties, and the angular dependency of EL spectrum radiation pattern on the deflection angle for a constant current are measured, and the quantum efficiency is calculated. As a result, the efficiency of light emission is 2.1 times higher than elements where no light extraction layer is provided.

Ninth Embodiment

In the following, the organic light emitting display device according to the ninth embodiment, which is another best mode for the present invention, is described.

The organic light emitting display device according to the ninth embodiment of the present invention has a structure where an OLED substrate and a facing substrate make contact with each other, and the structure provides a second light extraction layer between the OLED substrate and the facing substrate.

Figure 12:
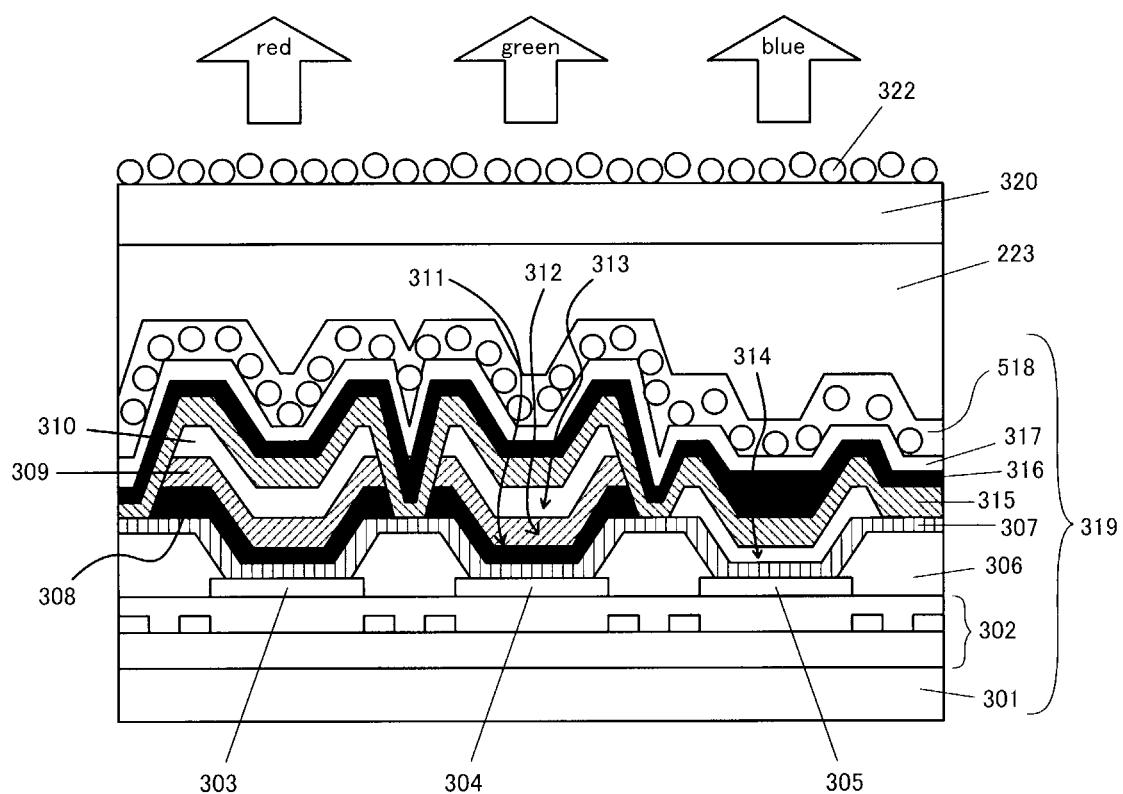
FIG. 12 is a cross sectional diagram showing still yet another organic light emitting display device.

FIG. 12 is a cross sectional diagram showing pixels in the organic light emitting display device according to the ninth embodiment of the present invention.

The conditions for fabricating a drive layer 302 and organic light emitting elements for forming R sub-pixels, G sub-pixels and B sub-pixels on a glass substrate 301 in FIG. 12 are the same as in the seventh embodiment. A protective film 317 is formed on top of an upper transparent electrode 316, which is a common electrode for the sub-pixels. The conditions for fabricating this are the same as in the seventh embodiment.

Next, a third light extraction layer 518 is formed on top of the protective film 317. The conditions for fabricating this are the same as in the eighth embodiment. As a result, the OLED substrate 319 is completed.

Next, a method for fabricating a facing substrate is described. The method for forming a second light extraction layer 322 and a thermosetting resin layer 323 on a glass substrate 320, which is the facing substrate, is the same as in the seventh embodiment.

The conditions for sealing the space between the OLED substrate 319 and the facing substrate 320 are also the same as in the seventh embodiment.

The brightness in the front direction, the current density-voltage properties, and the angular dependency of EL spectrum radiation pattern on the deflection angle for a constant current are measured, and the quantum efficiency is calculated. As a result, the efficiency of light emission is 2.1 times higher than elements where no light extraction layer is provided.

What is claimed is:

1. An organic light emitting element comprising:
   a first substrate;
   a light emitting layer provided adjacent to the first substrate;
   a pair of electrodes provided adjacent to the first substrate so as to sandwich the light emitting layer therebetween, one of the pair of electrodes being a transparent electrode;
   a protective layer disposed on the transparent electrode;
   a first light extraction layer having microscopic particles disposed therein;
   a second substrate which is disposed facing the first substrate;
   a second light extraction layer having microscopic particles disposed therein, the second light extraction layer being provided adjacent to and connected to the second substrate, the microscopic particles of the second light extraction layer being randomly arranged with an air gap formed between at least one of the microscopic particles and an adjacent microscopic particle in a planar direction of the second substrate, the microscopic particles of the second light extraction layer being connected by the second substrate;
   a resin layer made of any one of polyester resin, acryl resin, polycarbonate, polyethylene, and polypropylene being interposed between at least the first light extraction layer and the second light extraction layer, and at least making contact with the first light extraction layer;
   the second light extraction layer having an average index of refraction of 1.5 which is approximately the same as an index of refraction of the resin layer; and the microscopic particles of the first light extraction layer having an index of refraction of at least 2, and a material of the resin layer fills a space between the microscopic particles of the first light extraction layer.

2. The organic light emitting element according to claim 1, wherein the microscopic particles of the first light extraction layer include at least two types of microscopic particles having different average particle diameter.

3. The organic light emitting element according to claim 1, wherein the microscopic particles of the first light extraction layer have a cluster structure where the average diameter of the microscopic particles is no greater than 80 nm.

4. The organic light emitting element according to claim 1, wherein the transparent electrode is made of indium tin oxide or indium zinc oxide.

5. The organic light emitting element according to claim 1, wherein the protective layer is made of any one of $SiO_2$, SiN, $Al_2O_3$, polychloropyrene, polyethylene terephthalate, polyoxymethylene, polyvinyl chloride, polyvinylidene fluoride cyanoethyl pullulan, polymethyl methacrylate, polysulfone, polycarbonate and polyimide.

6. The organic light emitting element according to claim 1, wherein the microscopic particles of the first light extraction layer are made of any one of titania, zirconia, barium titanate and ZnS.

7. The organic light emitting element according to claim 1, wherein at least a portion of the microscopic particles of the second light extraction layer are connected by a binder in the second light extraction layer.

8. The organic light emitting element according to claim 1, wherein the second light extraction layer is provided between the resin layer and the second substrate.

9. The organic light emitting element according to claim 1, wherein the second substrate is provided between the resin layer and the second light extraction layer.

10. The organic light emitting element according to claim 1, wherein the microscopic particles of the first light extraction layer are connected by a support body in the first light extraction layer.

11. The organic light emitting element according to claim 10, wherein a film thickness of the support body in the first light extraction layer is in a range of 0.1 nm to 10 nm.

12. The organic light emitting element according to claim 1, wherein the microscopic particles of the first light extraction layer make contact with the resin layer in a direction normal to the first substrate.

* * * * *